(12) United States Patent
Agam et al.

(10) Patent No.: US 9,478,607 B2
(45) Date of Patent: Oct. 25, 2016

(54) ELECTRONIC DEVICE INCLUDING AN ISOLATION STRUCTURE (71) Applicant: Semiconductor Components Industries, LLC, Phoenix, AZ (US)

(72) Inventors: Moshe Agam, Portland, OR (US); Thierry Coffi Herve Yao, Portland, OR (US); Matthew Comard, West Linn, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 38 days.

(21) Appl. No.: 14/524,053

(22) Filed: Oct. 27, 2014

(65) Prior Publication Data

US 2016/0079344 A1    Mar. 17, 2016

Related U.S. Application Data

(60) Provisional application No. 62/049,099, filed on Sep. 11, 2014.

(51) Int. Cl.
| | |
|---|---|
| *H01L 29/06* | (2006.01) |
| *G01R 33/07* | (2006.01) |
| *H01L 29/78* | (2006.01) |
| *H01L 43/06* | (2006.01) |
| *H01L 29/66* | (2006.01) |
| *H01L 29/08* | (2006.01) |

(52) U.S. Cl.
CPC ............ *H01L 29/063* (2013.01); *G01R 33/07* (2013.01); *G01R 33/077* (2013.01); *H01L 29/0619* (2013.01); *H01L 29/66659* (2013.01); *H01L 29/66689* (2013.01); *H01L 29/7816* (2013.01); *H01L 29/7835* (2013.01); *H01L 43/065* (2013.01); *H01L 29/0653* (2013.01); *H01L 29/0878* (2013.01)

(58) Field of Classification Search
CPC ............ H01L 29/0615; H01L 29/063; H01L 29/0642
USPC ........................................................ 438/227
See application file for complete search history.

(56) References Cited

U.S. PATENT DOCUMENTS

| | | | |
|---|---|---|---|
| 4,466,011 A | 8/1984 | Van Zanten | |
| 5,438,005 A | 8/1995 | Jang | |
| 6,274,909 B1 | 8/2001 | Chang et al. | |
| 8,278,710 B2 | 10/2012 | Khemka et al. | |
| 2009/0034137 A1* | 2/2009 | Disney | ................ H01L 27/0251 361/56 |
| 2010/0171149 A1* | 7/2010 | Denison | ............... H01L 29/7436 257/173 |

* cited by examiner

*Primary Examiner* — Kenneth Parker
*Assistant Examiner* — Warren H Kilpatrick
(74) *Attorney, Agent, or Firm* — Abel Law Group, LLP (57) ABSTRACT

An electronic device can include a semiconductor layer having a primary surface, and an isolation structure. The isolation structure can include a first well region within the semiconductor layer and having a first conductivity, a second well region within the semiconductor layer and having a second conductivity type opposite the first conductivity type, and a third well region within the semiconductor layer having the first conductivity type. The second well region can be disposed between the first and third well regions. The first, second, and third well regions can be electrically connected to one another. The electronic device can help to allow more electrons during an electrostatic discharge or similar event to flow where the electrons will be less problematic. A process of forming the electronic device may be implemented with changes to existing masks without adding any processing operations.

20 Claims, 6 Drawing Sheets

ELECTRONIC DEVICE INCLUDING AN ISOLATION STRUCTURE

CROSS-REFERENCE TO RELATED APPLICATION

This application claims priority under 35 U.S.C. §119(e) to U.S. Provisional Patent Application No. 62/049,099, entitled "Electronic Device Including An Isolation Structure", by Agam et al., filed Sep. 11, 2014, which is assigned to the current assignee hereof and incorporated herein by reference in its entirety.

FIELD OF THE DISCLOSURE

The present disclosure relates to electronic devices and methods of forming electronic devices, and more particularly to, electronic devices including isolation structures and processes of forming the same.

RELATED ART

Electronic devices can include components and structures that may be sensitive to damage during electrostatic discharge or other events that do not occur during normal operation. Such components and structures should not sustain irreversible damage or should restrict an event to a localized area. Continued improvements in electronic devices to withstand electrostatic discharge and other events without damaging or causing other portions of the electronic device to operate improperly are desired.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a semiconductor layer having a primary surface, and an isolation structure. The isolation structure can include a first well region within the semiconductor layer and having a first conductivity, a second well region within the semiconductor layer and having a second conductivity type opposite the first conductivity type, and a third well region within the semiconductor layer having the first conductivity type. The second well region can be disposed between the first and third well regions. The first, second, and third well regions can be electrically connected to one another. The electronic device can help to allow more electrons during an electrostatic discharge or similar event to flow where the electrons will be less problematic. A process of forming the electronic device may be implemented with changes to existing masks. Thus, in a particular embodiment, no additional processing operations are added to the process flow.

FIGS. 1 to 5 illustrate a simplified process to form an isolation structure in accordance with an embodiment. The isolation structure laterally surrounds a protected region where electronic components will be formed. For simplicity, such electronic components are not illustrated to simplify understanding of the isolation structure and its formation. Occasional references to electronic components are made when portions of the isolation structure may be formed at the same time as portions of the electronic components.

Figure 1:
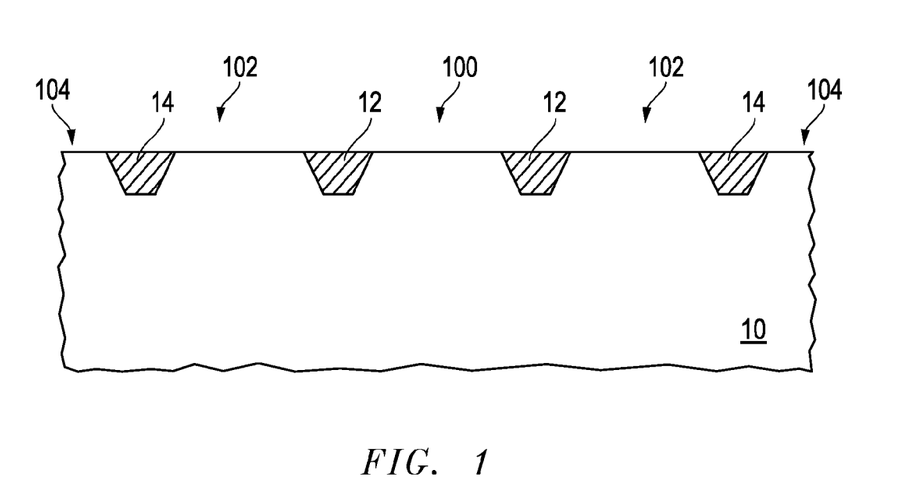
FIG. 1 includes an illustration of a cross-sectional view of a portion of the workpiece including a semiconductor layer and field isolation regions.

FIG. 1 includes an illustration of a cross-sectional view of a portion of a workpiece that includes a semiconductor layer 10 and field isolation regions 12 and 14. The semiconductor layer 10 can be in the form of a wafer or as a semiconductor layer formed over a substrate with or without any intervening layers. The semiconductor layer 10 can be lightly n-type or p-type doped. For the purposes of this specification, heavily doped is intended to mean a peak dopant concentration of at least $1 \times 10^{19}$ atoms/cm$^3$, and lightly doped is intended to mean a peak dopant concentration of less than $1 \times 10^{19}$ atoms/cm$^3$. In an embodiment, the semiconductor layer 10 includes a p-type dopant, such as boron. In a particular embodiment, the substrate has a dopant concentration in a range of $1 \times 10^{13}$ to $1 \times 10^{17}$ atoms/cm$^3$.

The field isolation regions 12 and 14 can be formed as shallow trench isolation regions. In another embodiment, a different technique, such as local oxidation of silicon, may be used. Other field isolation regions that lie between electronic components are also formed but are not illustrated in FIG. 1. The field isolation regions can include one or more layers of an insulating material, such as an oxide, a nitride, or an oxynitride. In another embodiment, the field isolation regions 12 and 14 may include a liner of an insulating layer with a remainder including a fill material, such as polysilicon. The depths of the field isolation regions 12 and 14 may be in a range of 0.2 microns to 3 microns.

In the embodiment as illustrated, the field isolation regions 12 and 14 have an annular shape. The field isolation region 12 surrounds a protected region 100 where one or more electronic components may be formed. An isolation region 102 surrounds the field isolation region 12 and is a location where an isolation structure will be subsequently formed. The field isolation region 14 surrounds the isolation region 102. A perimeter region 104 lies outside the field isolation region 14.

Figure 2:
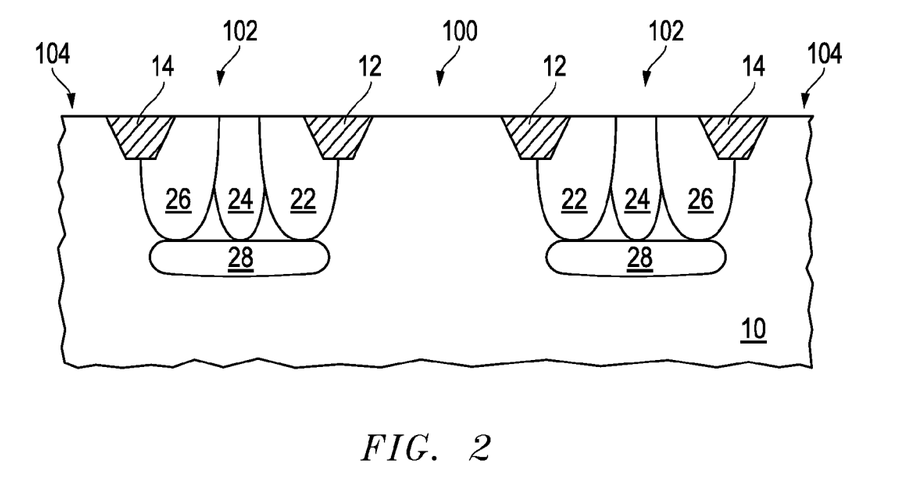
FIG. 2 includes an illustration of a cross-sectional view of the workpiece of FIG. 1 after forming well regions and a resurf region within an isolation region.

In FIG. 2, well regions 22, 24, and 26 and a resurf region 28 are formed within the isolation region 102. The well regions 22 and 26 can have the same conductivity type as the semiconductor layer 10. The well region 24 can have a conductivity type opposite that of the well regions 22 and 26. In a particular embodiment, the well regions 22 and 26 can be p-well regions, and the well region 24 can be an n-well region. Although not illustrated, other well regions can be formed for the electronic components. Thus, the well regions 22, 24, and 26 may be formed by simply changing a mask, and not adding an additional processing operation.

Peak dopant concentrations of the well regions 22, 24, and 26 may be in a range of $1 \times 10^{14}$ to $5 \times 10^{17}$ atoms/cm$^3$. The well regions 22, 24, and 26 may have the same doping concentration or different doping concentrations. In a particular embodiment, the well regions 22 and 26 have the same dopant concentration, and the well region 24 has a different dopant concentration.

The well regions 22, 24, and 26 have depths that may depend on the normal operating voltages of the electronic device. For example, an electronic device that operates with a 10 V difference between power supply terminals may have shallower well regions than an electronic device that operates with an 80 V difference between power supply terminals. In an embodiment, the well regions have depths in a range of 1 micron to 20 microns.

The resurf region 28 is optional and can be formed under the well regions 22, 24, and 26. The resurf region 28 can have the same conductivity type as the well regions 22 and 26. In a particular embodiment, the resurf region 28 can have a peak dopant concentration that is at least the same as the well regions 22 and 26. The depth of the resurf region 28 may be in a range of 0.5 micron to 5 microns. The well regions 22, 24, and 26, and resurf 28 may be formed in any order relative to one another.

Many processing operations can be performed in the fabrication of electronic components but are not illustrated in FIGS. 1 to 5. Such processing operations can include formation of any one or more of the following: an insulating or dielectric layer (e.g., an implant screen layer, a gate dielectric layer, a capacitor dielectric, or the like), a conductive layer (e.g., for a gate electrode, a capacitor electrode, a buried contact, or the like), a doped region (e.g., another well region, a halo or graded region, a threshold adjust implant, a resistor body implant, or the like), an anneal to activate or drive a dopant or to reduce stress, masking and etch operations, or another suitable operation.

Figure 3:
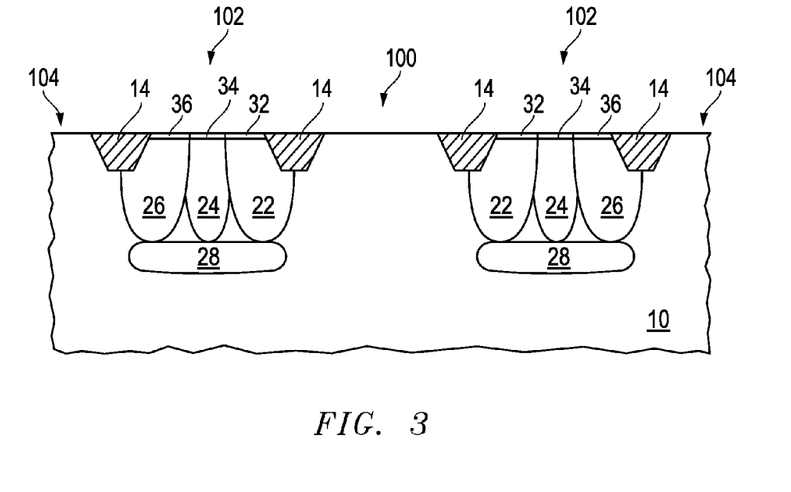
FIG. 3 includes an illustration of a cross-sectional view of the workpiece of FIG. 2 after forming heavily doped regions within the well regions.

In FIG. 3, heavily doped regions 32, 34, and 36 are formed within the well regions 22, 24, and 26 to allow ohmic contacts to be subsequently formed to the well regions 22, 24, and 26. The heavily doped regions 32, 34, and 36 have a peak concentration of at least $1 \times 10^{19}$ atoms/cm$^3$. In an embodiment, the heavily doped regions 32, 34, and 36 have a depth in a range of 0.05 micron to 1 micron, and in a particular embodiment, in a range of 0.1 micron to 0.5 micron. Each of the heavily doped regions 32, 34, and 36 has the same conductivity type as its underlying well region. In an embodiment, the heavily doped regions 32 and 36 have an opposite conductivity type as compared to the heavily doped region 34. In a particular embodiment, the heavily doped regions 32 and 36 are P$^+$ regions, and the heavily doped region 34 is an N$^+$ region. The heavily doped regions 32, 34, and 36 can be formed with other heavily doped regions, such as a source region, a drain region, a body contact region, an extrinsic base region, a resistor terminal, or the like.

Figure 4:
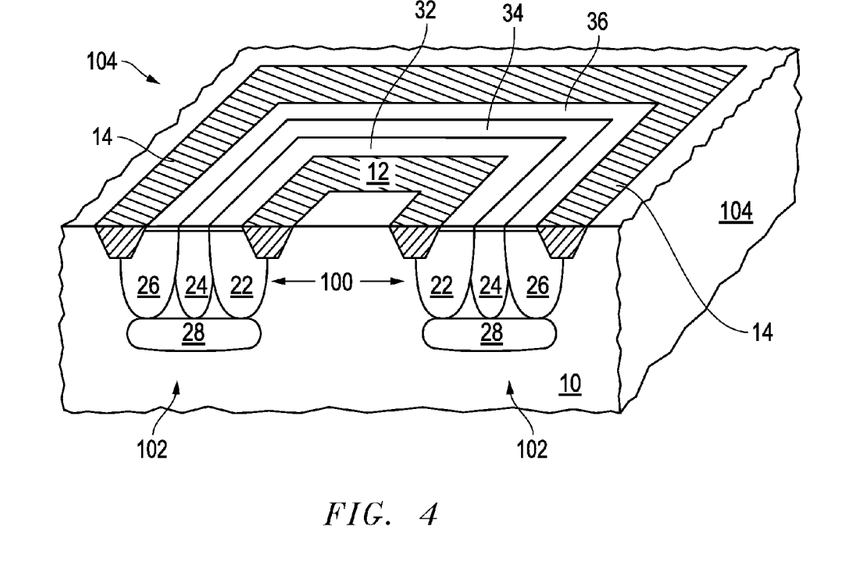
FIG. 4 includes an illustration of a hybrid perspective, cross-sectional view of the workpiece of FIG. 3.

FIG. 4 includes an illustration of a hybrid cross-sectional, perspective view of the workpiece after forming the heavily doped regions 32, 34, and 36. FIG. 4 illustrates that the protected region 100 is the region surrounded by the well region 22. The field isolation region 12 allows electronic components to be formed within the protected region 100 and be isolated from the isolation structure within the isolation region 102. If needed or desired, part or all of the field isolation region 12 can be removed if an electronic component is to be coupled to or include part of the isolation structure. The field isolation region 14 surrounds the isolation structure to allow electronic components to be formed within the perimeter region 104 and be isolated from the isolation structure within the isolation region 102. Similar to the field isolation region 12, part or all of the field isolation region 14 can be removed if an electronic component is to be coupled to or includes part of the isolation structure.

Figure 5:
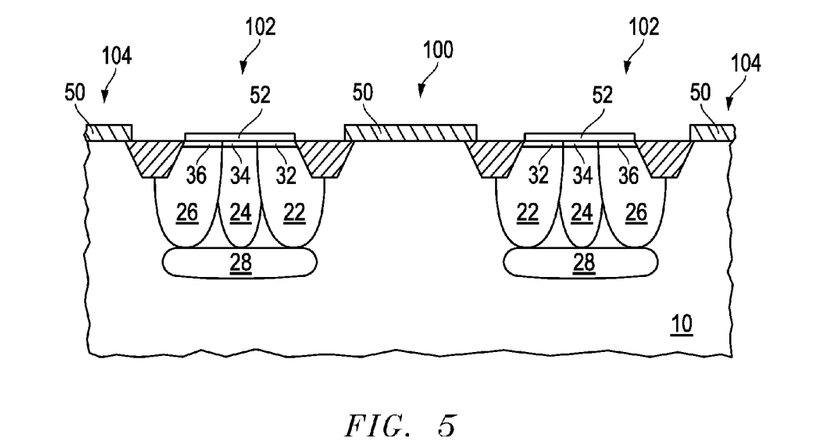
FIG. 5 includes an illustration of a cross-sectional view of the workpiece of FIG. 3 after forming a conductive member to electrically connect the well regions to one another.

In FIG. 5, an insulating layer 50 is formed over portions of the protected, isolation, and perimeter regions 100, 102, and 104 where conductive members are not to be subsequently formed. When the conductive members are formed using a self-aligned silicide process, the insulating layer 50 has a thickness sufficient to block a subsequently formed conductive layer from reacting with a semiconductor material within the protected, isolation, and perimeter regions 100, 102, and 104. The insulating layer 50 can have a thickness of at least 5 nm. While not limited by theory, making the insulating layer 50 several microns thick may waste resources in forming and unnecessarily complicate subsequent processing operations, such as a mask and etch operation. In a particular embodiment, the insulating layer 50 has a thickness in a range of 10 nm to 2000 nm. After reading this specification, skilled artisans will appreciate that other thicknesses may be used without deviating from the concepts as described herein. The insulating layer 50 may be formed by thermal oxidation, deposition of one or more insulating films, or a combination thereof. Portions of the insulating layer 50 are removed from locations where silicide regions are to be formed. The heavily doped regions 32, 34, and 36 are exposed at this point in the process. Although not illustrated, portions of electronic components within the protected and perimeter regions 100 and 104 are exposed. Such portions can include any one or more of the following: a source region, a drain region, a body contact region, an extrinsic base region, a resistor terminal, a gate electrode, a capacitor electrode, lightly-doped semiconductor material (for a Schottky contact), or the like.

A metal-containing layer is deposited over the workpiece. The metal-containing layer can include Ti, Ta, Co, W, or another suitable material capable of reacting with the exposed semiconductor material. The metal-containing layer has a thickness in a range of 5 nm to 200 nm. The metal-containing layer is reacted with the exposed semiconductor material to form the conductive member 52. Although not illustrated, other conductive members are also formed. The reaction may be performed in a range of 400° C. to 800° C. Portions of the metal-containing layer 50 that overlie an insulating material, such the field isolation regions 12 and 14 and the insulating layer 50, do not react. Unreacted portions of the metal-containing layer are removed, and the conductive member 52 and other conductive members remain. In a particular embodiment, the conductive member 52 and other conductive members have a metal silicide composition. At this point, a substantially completed isolation structure within the isolation region 102 is formed.

In an alternative embodiment, the conductive member 52 can include a different material and be formed at a different time. An interlevel dielectric (ILD) layer may be formed over workpiece and patterned to form locations for conductive plugs that can be used in conjunction with a first level of interconnects. The ILD layer can include one or more films each of which can include an oxide, a nitride, an oxynitride or a combination thereof. In an embodiment, the thickness of the ILD layer is in a range of 0.2 micron to 5 microns thick, and in a particular embodiment, is in a range of 0.5 micron to 2 microns. When pattering, an opening through the ILD layer is large enough so that at least portions of the heavily doped regions 32, 34, and 36 are exposed. A conductive layer can be deposited over the ILD layer and within the openings such that the openings are filled. In a particular embodiment, the conductive layer is a tungsten layer, and in another embodiment, a different conductive material may be used. Portions of the conductive layer that overlie the ILD layer can be removed by etching or polishing. Another ILD layer may be formed and patterned to define interconnect trenches, and interconnects may be formed within the interconnect trenches. One or more additional ILD layers and interconnect levels and a passivation layer may be formed, as needed or desired.

Figure 6:
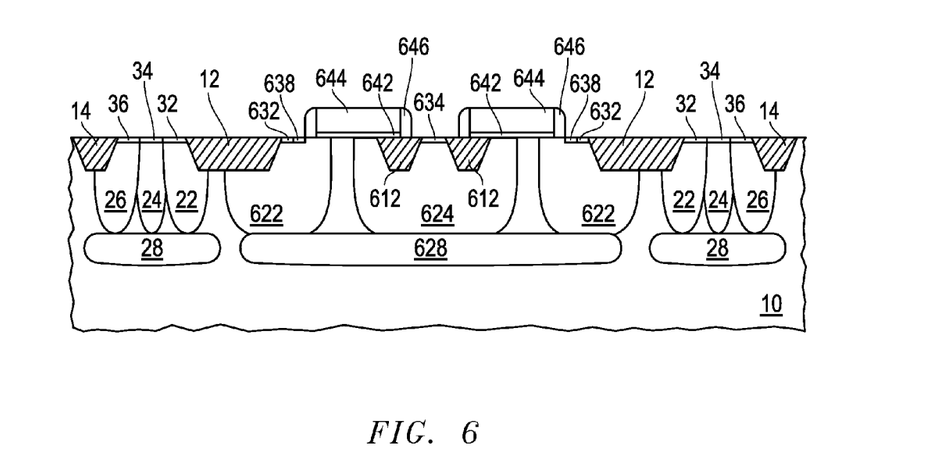
FIG. 6 includes an illustration of a cross-sectional view of a portion of workpiece that includes an isolation structure within an isolation region and an n-channel laterally diffused metal-oxide-semiconductor field-effect transistor within a protected region.
Figure 7:
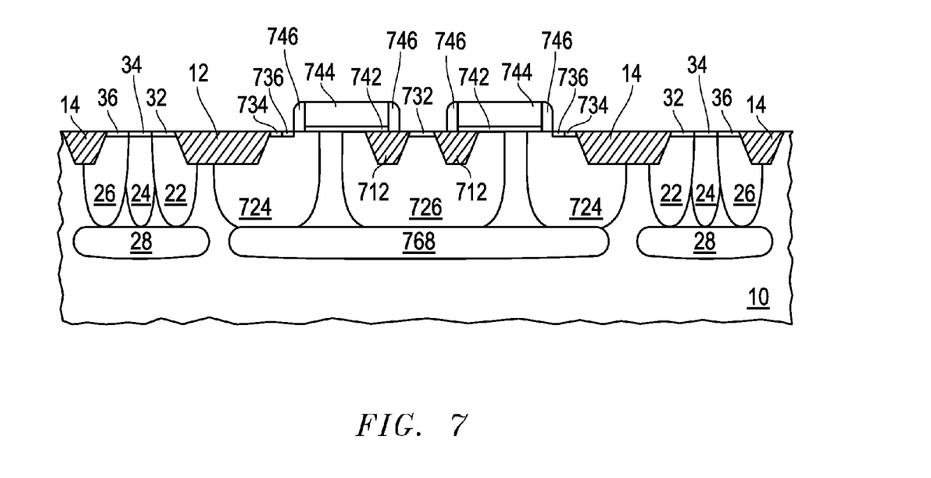
FIG. 7 includes an illustration of a cross-sectional view of a portion of workpiece that includes an isolation structure within an isolation region and a p-channel laterally diffused metal-oxide-semiconductor field-effect transistor within a protected region.
Figure 8:
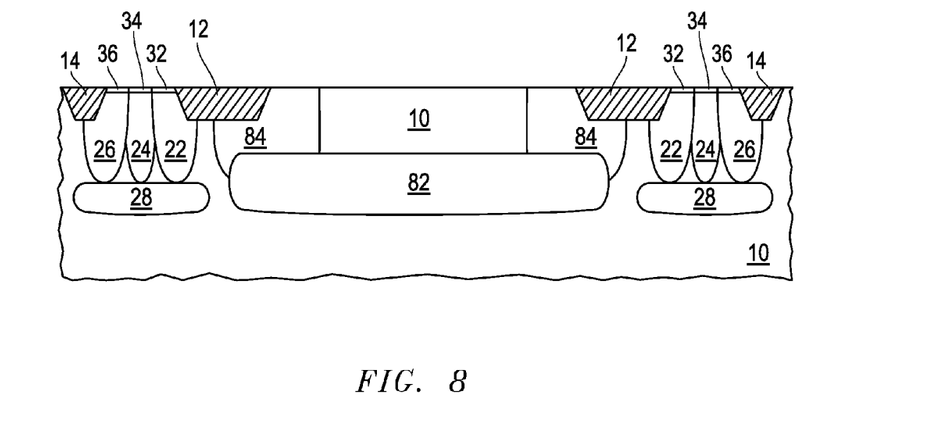
FIG. 8 includes an illustration of a cross-sectional view of a portion of workpiece that includes an isolation structure within an isolation region and a Hall sensor within a protected region.

FIGS. 6 to 8 illustrate some exemplary, non-limiting embodiments to illustrate some electronic components that can be located within the protected region. FIG. 6 includes an illustration of a cross-sectional view of a portion of an n-channel laterally diffused metal-oxide-semiconductor field-effect (NLDMOS) transistor. A field isolation region 612 may be formed at the same time as the field isolation regions 12 and 14. In another embodiment, the field isolation region 612 may be formed at a different time. A body region 622 has the same conductivity type as the well regions 22 and 26. In a particular embodiment, the body region 622 is a p-type region. The body region 622 can be formed at the same time as the well region 22 or 26 or may be formed separately from the well regions 22 and 26. In a particular embodiment, the body region 622 is formed at a different time and has a different peak dopant concentration compared to the well regions 22 and 26. A drift region 624 has the same conductivity type as the well region 24. In a particular embodiment, the drift region 624 is an n-type region. The drift region 624 can be formed at the same time as the well region 24 or may be formed separately from well region 24. In a particular embodiment, the drift region 624 is formed at a different time and has a different peak dopant concentration compared to the well region 24. A resurf region 628 has the same conductivity type as the resurf region 28. In a particular embodiment, the resurf region 628 is a p-type region. The resurf region 628 can be formed at the same time as the resurf region 28 or may be formed separately from resurf region 28.

A gate dielectric layer 642, a gate electrode 644, and sidewall spacers 646 are formed over portions of the body region 622 and the drift region 624. A drain region 634 and a source region 638 are formed within portions of the drift region 624 and the body region 622, respectively. The drain and source regions 634 and 638 have the same conductivity type, and in a particular embodiment, are heavily doped n-type regions. The drain and source regions 634 and 638 can be formed at the same time as the heavily doped region 34 or may be formed separately from heavily doped region 34. A body contact region 632 is formed within a portion of the body region 622. The body contact region 632 has the same conductivity type as the body region 622, and in a particular embodiment, is a heavily doped p-type region. The body contact region 632 can be formed at the same time as the heavily doped region 32 or 36 or may be formed separately from the heavily doped regions 32 and 36. Processing can continue as previously described with respect to FIG. 5. Conductive members will be formed from portions of the drain region 634, source region 638, body contact region 632, and gate electrode 644. The conductive member over the source region 632 and the body contact region 632 electrically short such regions to each other.

FIG. 7 includes an illustration of a cross-sectional view of a portion of an p-channel laterally diffused metal-oxide-semiconductor field-effect (PLDMOS) transistor. A field isolation region 712 may be formed at the same time as the field isolation regions 12 and 14. In another embodiment, the field isolation region 712 may be formed at a different time. A body region 724 has the same conductivity type as the well region 24. In a particular embodiment, the body region 724 is an n-type region. The body region 724 can be formed at the same time as the well region 24 or may be formed separately from well region 24. In a particular embodiment, the body region 724 is formed at a different time and has a different peak dopant concentration compared to the well regions 24. A drift region 726 has the same conductivity type as the well regions 22 and 26. In a particular embodiment, the drift region 726 is a p-type region. The drift region 726 can be formed at the same time as the well region 22 or 26 or may be formed separately from the well regions 22 and 26. In a particular embodiment, the drift region 726 is formed at a different time and has a different peak dopant concentration compared to the well regions 22 and 26. A resurf region 768 has an opposite conductivity as compared to the drift region 726. In a particular embodiment, the resurf region 768 is an n-type region. The resurf region 728 can have a higher peak dopant concentration as compared to the body region 724.

A gate dielectric layer 742, a gate electrode 744, and sidewall spacers 746 are formed over portions of the body region 724 and the drift region 726. A drain region 732 and a source region 736 are formed within portions of the drift region 726 and the body region 724, respectively. The drain and source regions 732 and 736 have the same conductivity type, and in a particular embodiment, are heavily doped p-type regions. The drain and source regions 732 and 736 can be formed at the same time as the heavily doped region 32 or 36 or may be formed separately from heavily doped regions 32 and 36. A body contact region 734 is formed within a portion of the body region 724. The body contact region 734 has the same conductivity type as the body region 724, and in a particular embodiment, is a heavily doped n-type region. The body contact region 732 can be formed at the same time as the heavily doped region 34 or may be formed separately from the heavily doped region 34. Processing can continue as previously described with respect to FIG. 5. Conductive members will be formed from portions of the drain region 732, source region 736, body contact region 734, and gate electrode 744. The conductive member over the source region 736 and the body contact region 734 electrically short such regions to each other.

FIG. 8 includes an illustration of a cross-sectional view of a portion of a Hall sensor. A Hall region 82 is formed as a buried doped region at a location spaced from the primary surface of the semiconductor layer 10, and a plug region 84 is formed between the primary surface and the Hall region 82. A Hall region 82 and the plug region 84 have the same conductivity type and opposite the conductivity type of the semiconductor layer 10. In a particular embodiment, the Hall and plug regions 82 and 84 are n-type regions.

FIGS. 6 to 8 illustrate just some of the electronic components that can be formed within the protected region. Many other components can be formed including logic transistors, cells, capacitors, diodes, resistors, inductors, or the like. Such components can be parts of circuits, such as memory cells, phase-lock loops, and higher level systems, such as a central processing unit, a graphics unit, or the like. Furthermore, other electronic components can be formed within the perimeter region 104. The electronic components may operate at different voltages or cause noise in the absence of an isolation structure. The electronic components that are part of circuits that step-up or step-down voltages for power supplies, reduce noise on power supply lines, or the like.

Figure 9:
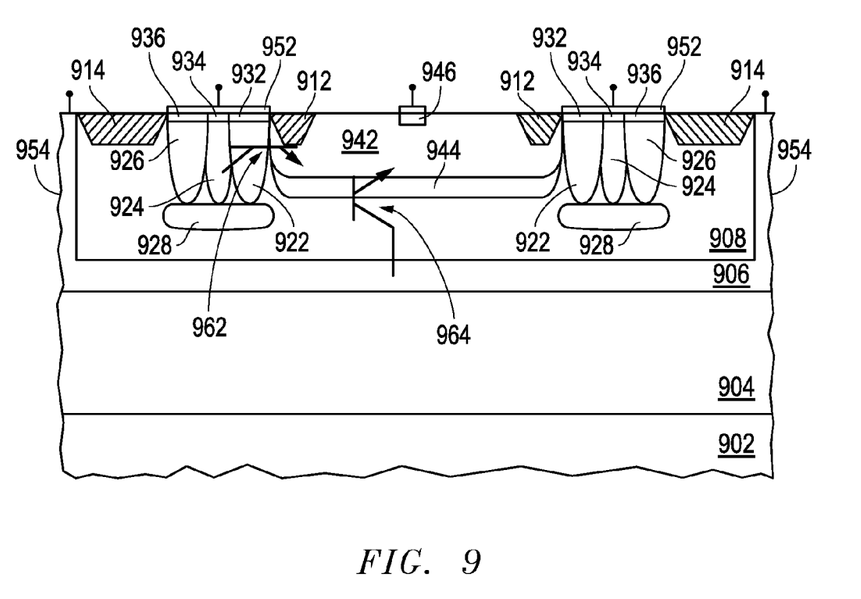
FIG. 9 includes an illustration of a cross-sectional view of a portion of workpiece for an innovative electronic device that includes an isolation structure in accordance with an embodiment described herein and its relationship to other layers and regions.
Figure 10:
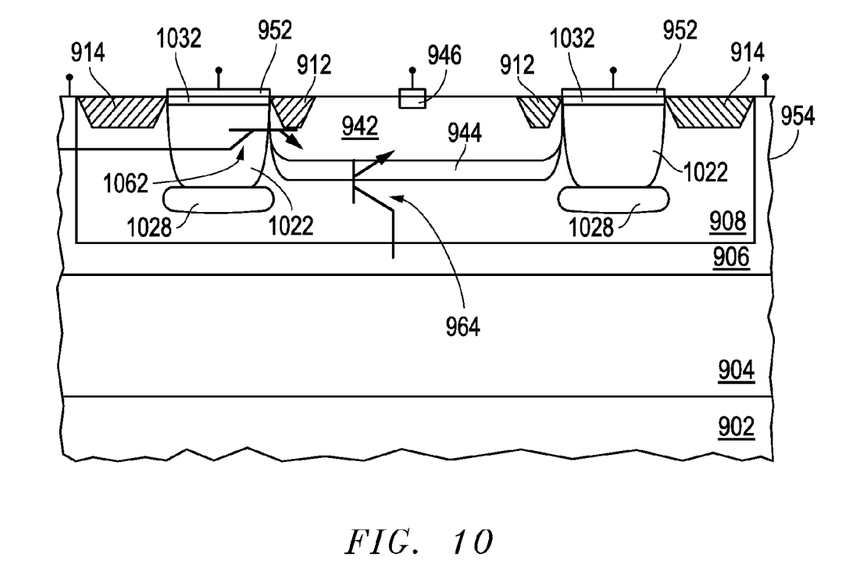
FIG. 10 includes an illustration of a cross-sectional view of a portion of workpiece for a comparative device that includes an isolation structure and its relationship to other layers and regions.

The improvement with the isolation structure is better understood by comparing an electronic device in accordance with an embodiment described herein (innovative device) with an electronic device with a different isolation structure (comparative device). FIGS. 9 and 10 include illustrations of cross-sectional views and are provided to demonstrate the improvement and do not necessarily represent actual electronic devices. Both devices include a P++ base material 902, an N− epitaxial layer 904, an N+ buried layer 906, and a P− epitaxial layer 908. N+ sinker region 954 extends from the primary surface of the P− epitaxial layer 908 to the N+ buried layer 906. Field isolation regions 912 and 914 are formed at least partly within the P− epitaxial layer 908. An n-well region 942 extends from the primary surface within the protected region, and an n-resurf region 944 underlies the n-well region 942. A heavily doped region 946 lies within the n-well region 942 at the primary surface.

The devices have different isolation structures. The innovative device has a p-well region 922, an n-well region 924, and an n-well region 926. A p-resurf region 928 lies below well regions 922, 924, and 926. Heavily doped regions 932, 934, and 936 allow ohmic contacts to be to the conductive member 952. The features described with respect to the innovative device are similar to the corresponding features as described with respect to FIGS. 1 to 5. The comparative device has a single p-well region 1022, a p-resurf region 1028 below the single p-well region 1022, a heavily doped region 1032, and a conductive member 1052.

The innovative device has a lateral bipolar transistor 962 and a vertical bipolar transistor 964. For the bipolar transistor 962, the n-well region 924 is the collector, the p-well region 922 is the base, and the n-well region 942 is the emitter. For the bipolar transistor 964, the N+ buried layer 906 is the collector, the P− epitaxial layer 908 is the base, and the n-resurf region 944 is the emitter. The comparative device has a lateral bipolar transistor 1062 and the vertical bipolar transistor 964. For the bipolar transistor 1062, the N+ sinker region 954 is the collector, the p-well region 1022 is the base, and the n-well region 942 is the emitter.

For modelling purposes, the N+ sinker region 954 and the N+ buried layer 908 may be coupled to a power supply terminal, such as $V_{DD}$, for example at 3.3 V. In the innovative device, the well regions 922, 924, and 924 may be at $V_{SS}$ or ground potential, and in the comparative device, the well region 1022 may be at $V_{SS}$ or ground potential. The n-resurf region 944 is at a higher potential as compared to the well regions 922, 924, and 926 in the innovative device, and at a higher potential as compared to the well region 1022 in the comparative device. In normal operation, the both bipolar transistors in both the innovative and comparative devices are off.

Figure 11:
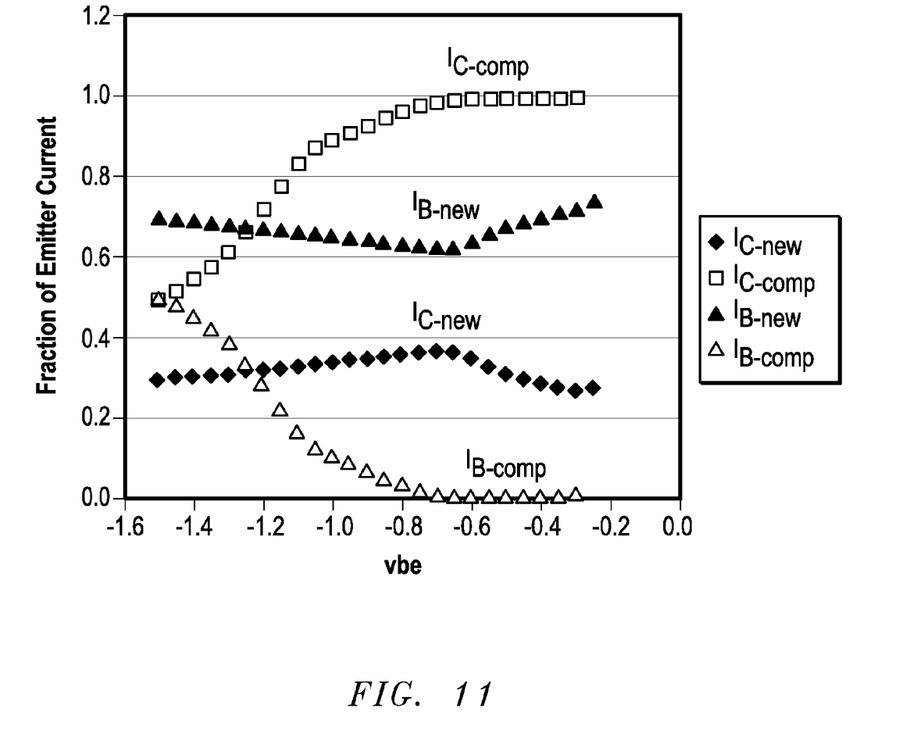
FIG. 11 includes a plot of fractions of current flowing through base and collector terminals as a function of a voltage difference between the base terminal and an emitter terminal for the devices as illustrated and described with respect to FIGS. 9 and 10.

During an electrostatic discharge (ESD) event, an excess of electrons can be received by heavily doped region 946 and enter the n-well region 942. As the potential on the n-well 942 is reduced, the bipolar transistors turn on. FIG. 11 includes a plot of the fraction of the current flowing though the collector terminal and through the base terminal.

In the innovative device, the well regions 922 and 924, which are the base and collector respectively of the bipolar transistor 962, are electrically connected to the base terminal. The N+ buried region 908 is electrically connected to the collector terminal. When the ESD event occurs, more of the current flows through the base terminal ($I_{B\text{-}new}$), corresponding to the bipolar transistor 962, as compared to the collector terminal ($I_{C\text{-}new}$), corresponding the bipolar transistor 964. When the voltage difference between the bases and emitters for the bipolar transistors is in a range of −1.5 V to −0.3 V, the fraction corresponding to $T_{B\text{-}new}$ is between 0.6 to 0.8, meaning that 60% to 80% of the current from the ESD event is flowing through the base terminal, and the remainder (20% to 40%) of the current, $I_{C\text{-}new}$, is flowing the collector terminal.

In the comparative device, the single p-well region 1022, which is the base of the bipolar transistor 1062, is electrically connected to the base terminal. The N+ sinker region 954, which is the collector of the bipolar transistor 1062, is electrically connected to the collector terminal. When the ESD event occurs, more of the current flows through the collector terminal ($I_{C\text{-}comp}$) as compared to the base terminal ($I_{B\text{-}comp}$). When the voltage difference between the bases and emitters for the bipolar transistors is −1.1 V and higher (i.e., closer to 0 V), the fraction for $I_{C\text{-}comp}$ is over 0.8, meaning that over 80% of the current from the ESD event is flowing through the collector terminal, and the remainder (less than 20%) of the current, $I_{B\text{-}comp}$, is flowing the base terminal. At −0.65 V and higher, nearly all of the current is flowing though the collector terminal ($I_{C\text{-}comp}$ is approximately 1.0, and $I_{B\text{-}comp}$ is nearly 0.0).

The ability to remove more of the electrons from the ESD event through the base terminal allows the innovative device to operate with a lesser likelihood of disturbing other electronic components within the protected region and the perimeter region (outside the isolation structure). After reading this specification, skilled artisans will appreciate that the modelling as described with respect to FIGS. 9 to 11 is provided to demonstrate that benefits in performance, and the appended claims are not limited to such structures.

Embodiments as described herein may be integrated relatively easily within an existing process flow. The well regions of the isolation structure can be formed with other n-well and p-well regions. The corresponding heavily doped regions can be formed with other N+ and P+ doped regions. The conductive member that electrically connects the well regions to one another can be formed as part of a silicide formation or as part of a contact plug process. Thus, changes may be made to existing masks, without adding any further masking or processing operations. Therefore, the enhancements to the electronic device can be obtained without increasing manufacturing costs.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device can include a semiconductor layer having a primary surface and an isolation structure. The isolation structure can include a first well region within the semiconductor layer and having a first conductivity, a second well region within the semiconductor layer and having a second conductivity type opposite the first conductivity type, and a third well region within the semiconductor layer having the first conductivity type. The second well region can be disposed between the first and third well regions, and the first, second, and third well regions can be electrically connected to one another.

Item 2. The electronic device of Item 1, further including a first heavily doped region within the first well region, a second heavily doped region within the second well region, a third heavily doped region within the third well region. and a conductive member that directly contacts each of the first, second, and third heavily doped regions.

Item 3. The electronic device of Item 1, further including an electronic component, wherein the electronic component is laterally surrounded by the isolation structure.

Item 4. The electronic device of Item 3, wherein the electronic component includes a transistor, a capacitor, a diode, a resistor, or any combination thereof.

Item 5. The electronic component of Item 3, further including a substrate, a buried doped region disposed between the substrate and the electronic component, and a conductive region extending from the primary surface of the semiconductor layer towards the buried conductive region. The isolation structure is disposed between the electronic component and the conductive region. The buried conductive region and the conductive region have the second conductivity type and are electrically connected to each other.

Item 6. The electronic device of Item 5, wherein the conductive region is coupled to a power supply terminal.

Item 7. The electronic device of Item 3, further including a first field isolation region disposed between the isolation structure and the electronic component.

Item 8. The electronic device of Item 7, further including a second field isolation region, wherein the first field isolation region abuts the first well region, and the second field isolation region abuts the third well region.

Item 9. The electronic device of Item 8, further including a resurf region disposed between the buried doped region and the first, second, and third wells.

Item 10. An electronic device can include:
  a substrate;
  a semiconductor layer overlying the substrate and having a primary surface and a first conductivity type; and
  an isolation structure including:
    a first well region within the semiconductor layer and having the first conductivity;
    a second well region within the semiconductor layer and having a second conductivity type opposite the first conductivity type; and
    a third well region within the semiconductor layer having the first conductivity type;
    a buried doped region disposed between the substrate and the electronic component;
    a sinker region extending from the primary surface of the semiconductor layer towards the buried conductive region;
  wherein:
    the buried conductive region and the sinker region have the second conductivity type and are electrically connected to each other; and
    each of the buried conductive region and the sinker region is spaced apart from the isolation structure by a portion of the semiconductor layer.

Item 11. The electronic device of Item 10, further including:
  a first field isolation region and a second isolation region, wherein the isolation structure is disposed between the first and second field isolation regions; and an electronic component laterally surrounded by the isolation structure and the first and second field isolation regions and overlying the buried conductive layer.

Item 12. The electronic device of Item 11, further including: a first resurf region disposed between the buried doped region and the first, second, and third wells; and a second resurf region lying between the electronic component and the buried doped region.

Item 13. A process of forming an electronic device can include:
- providing a substrate and a semiconductor layer overlying the substrate, wherein the semiconductor layer has primary surface;
- forming a first well region within the semiconductor layer and having a first conductivity type;
- forming a second well region within the semiconductor layer and having a second conductivity type opposite the first conductivity type;
- forming a third well region within the semiconductor layer having the first conductivity type; and
- electrically connecting the first, second, and third well regions to one another,
- wherein in a finished device:
  - the second well region is disposed between the first and third well regions; and
  - the first, second, and third well regions are parts of an isolation structure.

Item 14. The process of Item 13, wherein electrically connecting the first, second, and third well regions to one another includes forming a silicide region over the first, second, and third well regions.

Item 15. The process of Item 13, further including forming an electronic component, wherein the electronic component is laterally surrounded by the isolation structure.

Item 16. The process of Item 14, further including:
- forming a buried doped region having the second conductivity type; and
- forming a conductive region extending from the primary surface of the semiconductor layer and having the second conductivity type,
- wherein in the finish device:
  - the isolation structure is disposed between the electronic component and the conductive region;
  - a portion of the semiconductor layer is disposed between the buried doped region and the electronic component; and
  - the buried conductive region and the conductive region are electrically connected to each other.

Item 17. The process of Item 16, further including electrically connecting the conductive region to a power supply terminal.

Item 18. The process of Item 14, further including forming a first field isolation region, wherein in the finished device, the first field isolation region is disposed between the isolation structure and the electronic component.

Item 19. The process of Item 18, further including forming a second field isolation region, wherein in the finished device, the first field isolation region abuts the first well region, and the second field isolation region abuts the third well region.

Item 20. The electronic device of Item 19, further including forming a resurf region, wherein in the finished device, the resurf region is disposed between the buried doped region and the first, second, and third wells.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a semiconductor layer having a primary surface; and
   an isolation structure comprising:
      a first well region within the semiconductor layer and having a first conductivity;
      a second well region within the semiconductor layer and having a second conductivity type opposite the first conductivity type; and
      a third well region within the semiconductor layer having the first conductivity type,
      wherein:
         the second well region is disposed between the first and third well regions; and
         the first, second, and third well regions are electrically connected to one another.

2. The electronic device of claim 1, further comprising:
   a first heavily doped region within the first well region;
   a second heavily doped region within the second well region;
   a third heavily doped region within the third well region; and
   a conductive member that directly contacts each of the first, second, and third heavily doped regions.

3. The electronic device of claim 1, further comprising an electronic component, wherein the electronic component is laterally surrounded by the isolation structure.

4. The electronic device of claim 3, wherein the electronic component comprises a transistor, a capacitor, a diode, a resistor, or any combination thereof.

5. The electronic component of claim 3, further comprising:
   a substrate;
   a buried doped region disposed between the substrate and the electronic component; and a conductive region extending from the primary surface of the semiconductor layer towards the buried conductive region, wherein:
the isolation structure is disposed between the electronic component and the conductive region; and
the buried conductive region and the conductive region have the second conductivity type and are electrically connected to each other.

6. The electronic device of claim 5, wherein the conductive region is coupled to a power supply terminal.

7. The electronic device of claim 3, further comprising a first field isolation region disposed between the isolation structure and the electronic component.

8. The electronic device of claim 7, further comprising a second field isolation region, wherein the first field isolation region abuts the first well region, and the second field isolation region abuts the third well region.

9. The electronic device of claim 8, further comprising a resurf region disposed between the buried doped region and the first, second, and third wells.

10. An electronic device comprising:
a substrate;
a semiconductor layer overlying the substrate and having a primary surface and a first conductivity type; and
an isolation structure comprising:
a first well region within the semiconductor layer and having the first conductivity;
a second well region within the semiconductor layer and having a second conductivity type opposite the first conductivity type; and
a third well region within the semiconductor layer having the first conductivity type;
a buried doped region disposed between the substrate and the electronic component;
a sinker region extending from the primary surface of the semiconductor layer towards the buried conductive region;
wherein:
the buried conductive region and the sinker region have the second conductivity type and are electrically connected to each other; and
each of the buried conductive region and the sinker region is spaced apart from the isolation structure by a portion of the semiconductor layer.

11. The electronic device of claim 10, further comprising:
a first field isolation region and a second isolation region, wherein the isolation structure is disposed between the first and second field isolation regions; and
an electronic component laterally surrounded by the isolation structure and the first and second field isolation regions and overlying the buried conductive layer.

12. The electronic device of claim 11, further comprising:
a first resurf region disposed between the buried doped region and the first, second, and third wells; and
a second resurf region lying between the electronic component and the buried doped region.

13. A process of forming an electronic device comprising:
providing a substrate and a semiconductor layer overlying the substrate, wherein the semiconductor layer has primary surface;
forming a first well region within the semiconductor layer and having a first conductivity type;
forming a second well region within the semiconductor layer and having a second conductivity type opposite the first conductivity type;
forming a third well region within the semiconductor layer having the first conductivity type; and
electrically connecting the first, second, and third well regions to one another,
wherein in a finished device:
the second well region is disposed between the first and third well regions; and
the first, second, and third well regions are parts of an isolation structure.

14. The process of claim 13, wherein electrically connecting the first, second, and third well regions to one another comprises forming a silicide region over the first, second, and third well regions.

15. The process of claim 13, further comprising forming an electronic component, wherein the electronic component is laterally surrounded by the isolation structure.

16. The process of claim 14, further comprising:
forming a buried doped region having the second conductivity type; and
forming a conductive region extending from the primary surface of the semiconductor layer and having the second conductivity type,
wherein in the finish device:
the isolation structure is disposed between the electronic component and the conductive region;
a portion of the semiconductor layer is disposed between the buried doped region and the electronic component; and
the buried conductive region and the conductive region are electrically connected to each other.

17. The process of claim 16, further comprising electrically connecting the conductive region to a power supply terminal.

18. The process of claim 14, further comprising forming a first field isolation region, wherein in the finished device, the first field isolation region is disposed between the isolation structure and the electronic component.

19. The process of claim 18, further comprising forming a second field isolation region, wherein in the finished device, the first field isolation region abuts the first well region, and the second field isolation region abuts the third well region.

20. The process of claim 19, further comprising forming a resurf region, wherein in the finished device, the resurf region is disposed between the buried doped region and the first, second, and third wells.

* * * * *